US011483722B2

(12) United States Patent
Henia et al.

(10) Patent No.: US 11,483,722 B2
(45) Date of Patent: Oct. 25, 2022

(54) MULTI-BAND REMOTE UNIT IN A WIRELESS COMMUNICATIONS SYSTEM (WCS)

(71) Applicant: Corning Research & Development Corporation, Corning, NY (US)

(72) Inventors: Yona Henia, Mazkeret Batia (IL); Roi Yosy Ziv, Ramat Gan (IL)

(73) Assignee: Corning Research & Development Corporation, Corning, NY (US)

( * ) Notice: Subject to any disclaimer, the term of this patent is extended or adjusted under 35 U.S.C. 154(b) by 209 days.

(21) Appl. No.: 16/573,661

(22) Filed: Sep. 17, 2019

(65) Prior Publication Data
US 2021/0084504 A1 Mar. 18, 2021

(51) Int. Cl.
| | |
|---|---|
| *H04W 24/02* | (2009.01) |
| *H04W 72/04* | (2009.01) |
| *H04W 88/08* | (2009.01) |
| *H03M 1/86* | (2006.01) |
| *H03M 1/60* | (2006.01) |

(52) U.S. Cl.
CPC .......... *H04W 24/02* (2013.01); *H03M 1/60* (2013.01); *H03M 1/86* (2013.01); *H04W 72/042* (2013.01); *H04W 72/0413* (2013.01); *H04W 72/0433* (2013.01); *H04W 72/0453* (2013.01); *H04W 88/085* (2013.01)

(58) Field of Classification Search
CPC .......... H04W 24/02; H04W 72/0413; H04W 72/042; H04W 72/0433; H04W 72/0453; H04W 88/085; H03M 1/60; H03M 1/86
See application file for complete search history.

(56) References Cited

U.S. PATENT DOCUMENTS

| | | | |
|---|---|---|---|
| 9,941,921 B2 | 4/2018 | Wala et al. | |
| 9,961,688 B1* | 5/2018 | Anvari | H04L 47/193 |
| 10,044,367 B1* | 8/2018 | Azadet | H03M 7/304 |
| 2005/0206490 A1* | 9/2005 | Castaneda | H03F 3/24 |
| | | | 336/223 |
| 2008/0232305 A1* | 9/2008 | Oren | H04B 7/0602 |
| | | | 370/328 |

(Continued)

*Primary Examiner* — Ayaz R Sheikh
*Assistant Examiner* — Tarell A Hampton
(74) *Attorney, Agent, or Firm* — C. Keith Montgomery

(57) ABSTRACT

A multi-band remote unit is disclosed. The multi-hand remote unit includes a number of radio frequency (RF) front-end circuits configured to generate a number of downlink RF communications signals associated with a number of frequency bands based on a number of downlink digital communications signals, respectively. The multi-band remote unit also includes a digital interface circuit and a digital processing circuit. The digital interface circuit is configured to receive an encapsulated downlink digital communications signal and generate the downlink digital communications signals associated with the frequency bands based on the encapsulated downlink digital communications signal. The digital processing circuit is configured to digitally process the downlink digital communications signals before providing the downlink digital communications signals to the RF front-end circuits. As such, it may be possible to share the digital processing circuit among RF front-end circuits, thus helping to reduce cost and/or power consumption of the multi-band remote unit.

21 Claims, 9 Drawing Sheets

(56) References Cited

U.S. PATENT DOCUMENTS

| | | | |
|---|---|---|---|
| 2009/0175381 A1* | 7/2009 | Bougard | H04B 1/406 375/316 |
| 2010/0151898 A1* | 6/2010 | Lee | H04B 7/0608 455/522 |
| 2010/0278530 A1* | 11/2010 | Kummetz | H04B 10/2575 398/41 |
| 2011/0135308 A1* | 6/2011 | Tarlazzi | H04J 14/0252 398/79 |
| 2011/0201368 A1* | 8/2011 | Faccin | H04B 7/022 455/507 |
| 2012/0039320 A1* | 2/2012 | Lemson | H04W 40/02 370/338 |
| 2012/0069880 A1* | 3/2012 | Lemson | H04B 1/18 375/220 |
| 2013/0188753 A1* | 7/2013 | Tarlazzi | H04B 7/0413 375/299 |
| 2014/0072064 A1* | 3/2014 | Lemson | H04B 10/25753 375/267 |
| 2014/0140225 A1* | 5/2014 | Wala | H04B 7/0613 370/252 |
| 2015/0188585 A1* | 7/2015 | Laurent-Michel | H01Q 19/13 375/349 |
| 2015/0365117 A1* | 12/2015 | May | H04B 1/16 375/316 |
| 2016/0041579 A1* | 2/2016 | Ali | H03L 7/00 713/400 |
| 2016/0329631 A1* | 11/2016 | Rheinfelder | H04L 43/106 |
| 2017/0026104 A1* | 1/2017 | Lange | H04B 7/14 |
| 2017/0317738 A1* | 11/2017 | Lange | H04W 56/0015 |
| 2018/0083673 A1* | 3/2018 | Berlin | H04B 7/022 |
| 2018/0323843 A1* | 11/2018 | Li | H04W 72/042 |
| 2020/0195280 A1* | 6/2020 | Burra | H04B 1/48 |

* cited by examiner

MULTI-BAND REMOTE UNIT IN A WIRELESS COMMUNICATIONS SYSTEM (WCS)

BACKGROUND

The disclosure relates generally to a remote unit(s) configured to communicate downlink and uplink communications signals in multiple radio frequency (RF) bands in a wireless communication system (WCS), such as a distributed antenna system (DAS).

Wireless communications is rapidly growing, with ever-increasing demands for high-speed mobile data communication. As an example, local area wireless services (e.g., so-called "wireless fidelity" or "WiFi" systems) and wide area wireless services are being deployed in many different types of areas (e.g., coffee shops, airports, libraries, etc. Communications systems have been provided to transmit and/or distribute communications signals to wireless devices called "clients," "client devices," or "wireless client devices," which must reside within the wireless range or "cell coverage area" in order to communicate with an access point device. Example applications where communications systems can be used to provide or enhance coverage for wireless services include public safety, cellular telephony, wireless local access networks (LANs), location tracking, and medical telemetry inside buildings and over campuses. One approach to deploying a communications system involves the use of radio node base station that transmits communications signals distributed over a physical communications medium remote unit forming RF antenna coverage areas, also referred to as "antenna coverage areas." The remote units each contain or are configured to couple to one or more antennas configured to support the desired frequency(ies) of the radio node to provide the antenna coverage areas. Antenna coverage areas can have a radius in the range from a few meters up to twenty meters, as an example. Another example of a communications system includes radio nodes, such as base stations, that form cell radio access networks, wherein the radio nodes are configured to transmit communications signals wirelessly directly to client devices without being distributed through intermediate remote units.

For example, FIG. 1 is an example of a distributed communications system (DCS) 100 that includes a radio node 102 configured to support one or more service providers 104(1)-104(N) as signal sources (also known as "carriers" or "service operators"—e.g., mobile network operator (MNO)) and wireless client devices 106(1)-106(W). For example, the radio node 102 may be a base station (eNodeB) that includes modem functionality and is configured to distribute communications signal streams 108(1)-108(S) to the wireless client devices 106(1)-106(W) based on downlink communications signals 110(1)-110(N) received from the service providers 104(1)-104(N). The communications signal streams 108(1)-108(S) of each respective service provider 104(1)-104(N) in their different spectrums are radiated through antennas 112 to the wireless client devices 106(1)-106(W) in communication range of the antennas 112. For example, the antenna 112 may be an antenna array. As another example, the radio node 102 in the DCS 100 in FIG. 1 can be a small cell radio access node ("small cell") that is configured to support multiple service providers 104(1)-104(N) by distributing a communications signal stream 108(1)-108(S) for the multiple service providers 104(1)-104(N) based on respective downlink communications signals 110(1)-110(N) received from a respective evolved packet core (EPC) network $CN_1$-$CN_N$ of the service provider 104(1)-104(N) through interface connections. The radio node 102 includes a radio circuit 118(1)-118(N) for each service provider 104(1)-404(N) that is configured to create multiple simultaneous signal beams ("beams") 120(1)-120(N) for the communications signal streams 108(1)-108(S) to serve multiple wireless client devices 106(1)-106(W). For example, the multiple beams 120(1)-120(N) may support multiple-input, multiple-output (MIMO) communications.

The radio node 102 of the DCS 100 in FIG. 1 may be configured to support service providers 104(1)-104(N) that have different frequency spectrum and do not share spectrum. Thus in this instance, the downlink communications signals 110(1)-110(N) from the different service providers 104(1)-104(N) do not interfere with each other even if transmitted by the radio node 102 at the same time. The radio node 102 may also be configured as a shared spectrum communications system where the multiple service providers 104(1)-404(N) have shared spectrum. In this regard, the capacity supported by the radio node 102 for the shared spectrum is split (i.e. shared) between the multiple service providers 104(1)-104(N) for providing services to the subscribers.

The radio node 102 in FIG. 1 can also be coupled to a distributed communications system, such as a distributed antenna system (DAS), such that the radio circuits 118(1)-118(N) remotely distribute the downlink communications signals 110(1)-110(N) of the multiple service providers 104(1)-104(N) to remote units. The remote units each include an antenna that may be similar to the antenna 112 in FIG. 1 for radiating the downlink communications signals 110(1)-110(N) to subscribers. Notably, each of the remote units may be configured to communicate the downlink communications signals 110(1)-110(N) in one or more frequency bands. In addition, each of the remote units may also be configured to receive uplink communications signals in one or more frequency bands.

No admission is made that any reference cited herein constitutes prior art. Applicant expressly reserves the right to challenge the accuracy and pertinency of any cited documents.

SUMMARY

Embodiments disclosed herein include a multi-band remote unit for a wireless communications system (WCS). The multi-band remote unit includes a number of radio frequency (RF) front-end circuits configured to generate a number of downlink RF communications signals associated with a number of frequency bands based on a number of downlink digital communications signals, respectively. The multi-band remote unit also includes a digital interface circuit and a digital processing circuit. The digital interface circuit is configured to receive an encapsulated downlink digital communications signal and generate the downlink digital communications signals associated with the frequency bands based on the encapsulated downlink digital communications signal. The digital processing circuit is configured to digitally process the downlink digital communications signals before providing the downlink digital communications signals to the RF front-end circuits. In one embodiment, the digital interface circuit and the digital processing circuit can be provided in a digital front-end integrated circuit (IC) and the RF front-end circuits can be provided outside the digital front-end IC. In another embodiment, the digital interface circuit and the digital processing circuit can be provided in a digital front-end printed circuit board (PCB) and the RF front-end circuits can be provided in another PCB(s) separated from the digital front-end PCB. By separating the digital processing circuit from the RF front-end circuits, it may be possible to share the digital processing circuit among the RF front-end circuits for processing the downlink digital communications signals, thus helping to reduce cost and/or power consumption of the multi-band remote unit.

One exemplary embodiment of the disclosure relates to a multi-band remote unit for a WCS. The multi-band remote unit includes a digital front-end IC. The digital front-end IC includes a digital interface circuit communicatively coupled to a central unit in the WCS. The digital interface circuit is configured to receive an encapsulated downlink digital communications signal corresponding to a plurality of frequency bands from the central unit. The digital interface circuit is also configured to generate a plurality of downlink digital communications signals associated with the plurality of frequency bands, respectively, based on the encapsulated downlink digital communications signal. The digital front-end IC also includes a digital processing circuit configured to receive and digitally process the plurality of downlink digital communications signals. The multi-band remote unit also includes a plurality of RF front-end circuits provided outside the digital front-end IC. The plurality of RF front-end circuits is configured to receive the plurality of downlink digital communications signals, respectively, from the digital processing circuit. The plurality of RF front-end circuits is also configured to convert the plurality of downlink digital communications signals into a plurality of downlink RF communications signals for transmission in the plurality of frequency bands, respectively.

An additional exemplary embodiment of the disclosure relates to a multi-band remote unit for a WCS. The multi-band remote unit includes a digital front-end PCB. The digital front-end PCB includes a digital interface circuit communicatively coupled to a central unit in the WCS. The digital interface circuit is configured to receive an encapsulated downlink digital communications signal corresponding to a plurality of frequency bands from the central unit. The digital interface circuit is also configured to generate a plurality of downlink digital communications signals associated with the plurality of frequency bands, respectively, based on the encapsulated downlink digital communications signal. The digital front-end PCB also includes a digital processing circuit configured to receive and digitally process the plurality of downlink digital communications signals. The multi-band remote unit also includes a plurality of RF front-end circuits provided outside the digital front-end PCB. The plurality of RF front-end circuits is configured to receive the plurality of downlink digital communications signals, respectively, from the digital processing circuit. The plurality of RF front-end circuits is also configured to convert the plurality of downlink digital communications signals into a plurality of downlink RF communications signals for transmission in the plurality of frequency bands, respectively.

Additional features and advantages will be set forth in the detailed description which follows, and in part will be readily apparent to those skilled in the art from the description or recognized by practicing the embodiments as described in the written description and claims hereof, as well as the appended drawings.

It is to be understood that both the foregoing general description and the following detailed description are merely exemplary, and are intended to provide an overview or framework to understand the nature and character of the claims.

The accompanying drawings are included to provide a further understanding, and are incorporated in and constitute a part of this specification. The drawings illustrate one or more embodiment(s), and together with the description serve to explain principles and operation of the various embodiments.

DETAILED DESCRIPTION

Embodiments disclosed herein include a multi-band remote unit for a wireless communications system (WCS). The multi-band remote unit includes a number of radio frequency (RF) front-end circuits configured to generate a number of downlink RF communications signals associated with a number of frequency bands based on a number of downlink digital communications signals, respectively. The multi-band remote unit also includes a digital interface circuit and a digital processing circuit. The digital interface circuit is configured to receive an encapsulated downlink digital communications signal and generate the downlink digital communications signals associated with the frequency bands based on the encapsulated downlink digital communications signal. The digital processing circuit is configured to digitally process the downlink digital communications signals before providing the downlink digital communications signals to the RF front-end circuits. In one embodiment, the digital interface circuit and the digital processing circuit can be provided in a digital front-end integrated circuit (IC) and the RF front-end circuits can be provided outside the digital front-end IC. In another embodiment, the digital interface circuit and the digital processing circuit can be provided in a digital front-end printed circuit board (PCB) and the RF front-end circuits can be provided in another PCB(s) separated from the digital front-end. PCB. By separating the digital processing circuit from the RF front-end circuits, it may be possible to share the digital processing circuit among the RF front-end circuits for processing the downlink digital communications signals, thus helping to reduce cost and/or power consumption of the multi-band remote unit.

Figure 2A:
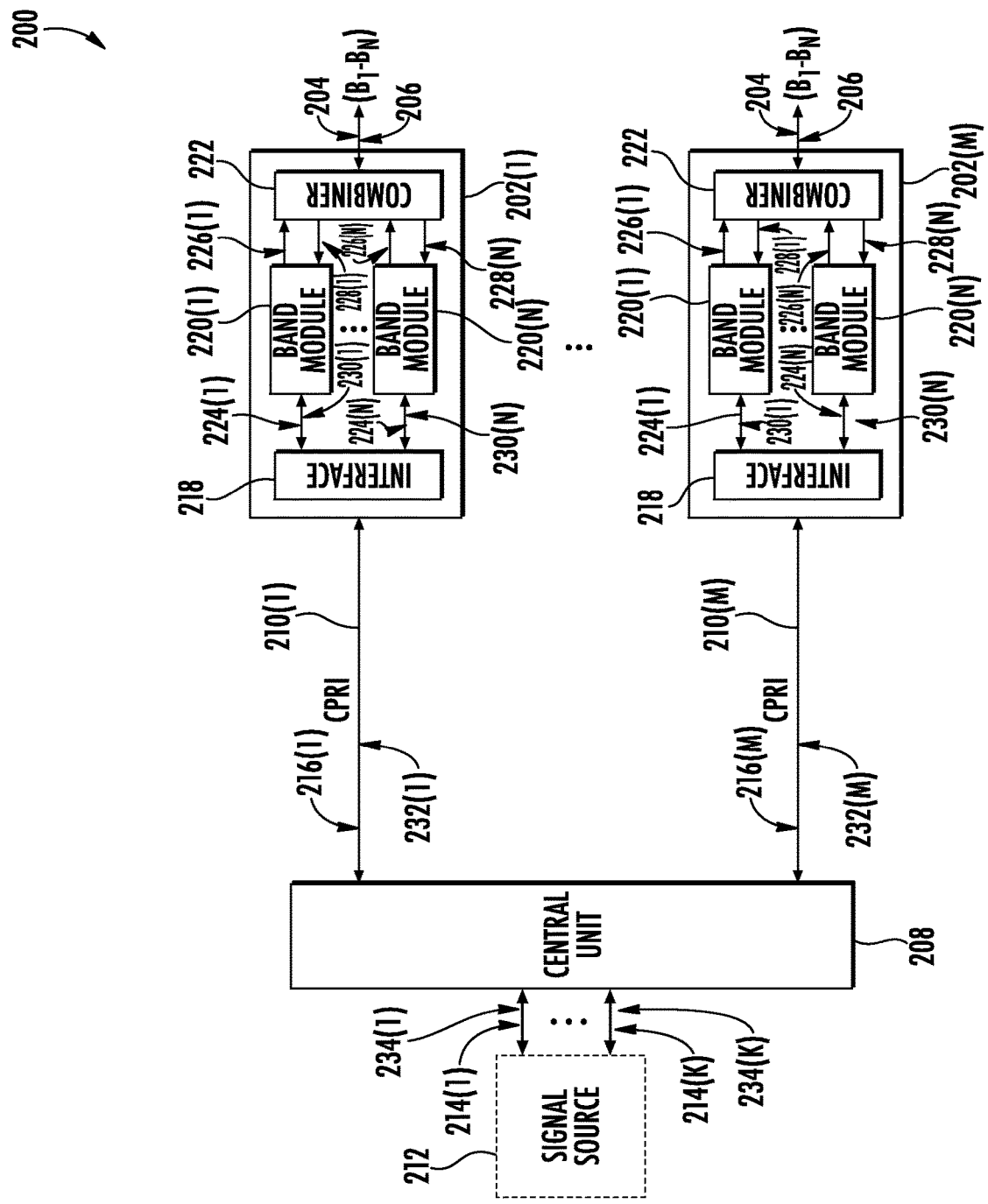
FIG. 2A is a schematic diagram of an exemplary existing wireless communications system (WCS), such as the DCS of FIG. 1, that includes a plurality of existing multi-band remote units each configured to transmit a combined downlink RF communications signal and receive a combined uplink RF communications signal in a plurality of frequency bands.

Before discussing the multi-band remote unit of the present disclosure, a brief overview of an existing WCS having multiple existing multi-band remote units is first provided with reference to FIGS. 2A and 28. The discussion of specific exemplary aspects of a multi-hand remote unit of the present disclosure starts below with reference to FIG. 3.

Figure 1:
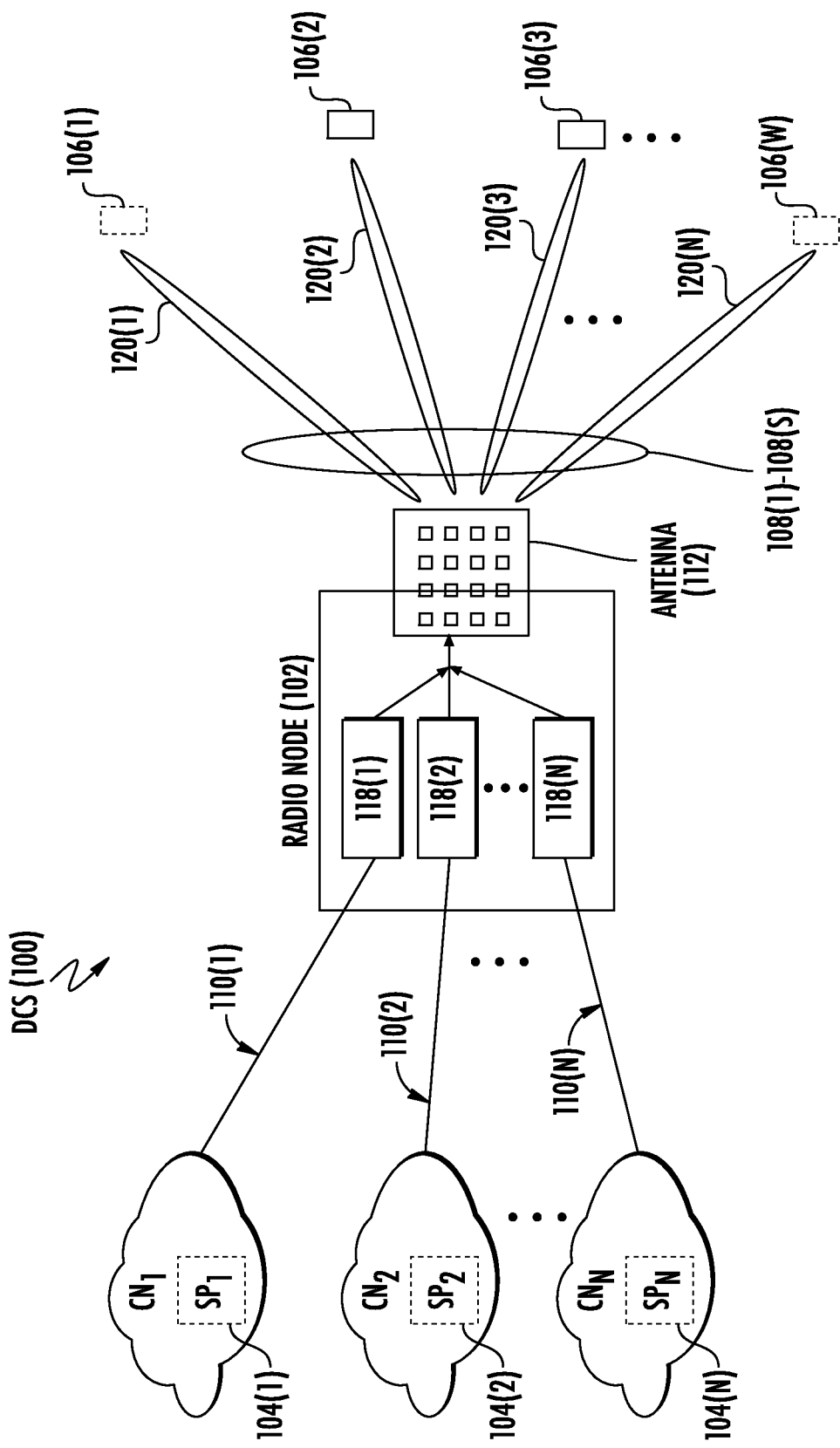
FIG. 1 is a schematic diagram of an exemplary distributed communications system (DCS) that includes a conventional single operator radio node configured to support distribution of communications signals for multiple service providers.

FIG. 2A is a schematic diagram of an exemplary existing WCS 200, such as the distributed communication system (DCS) 100 of FIG. 1, that includes a number of existing multi-band remote units 202(1)-202(M) each configured to transmit a combined downlink RF communications signal 204 and receive a combined uplink RF communications signal 206 in a plurality of frequency bands $B_1$-$B_N$. Notably, each of the existing multi-band remote units 202(1)-202(M) may be configured to communicate the combined downlink RF communications signal 204 and the combined uplink RF communications signal 206 in different combination of the frequency bands $B_1$-$B_N$. For example, the existing multi-band remote unit 202(1) may communicate the respective combined downlink RF communications signal 204 and the respective combined uplink RF communications signal 206 in 700 MHz and 850 MHz bands, while the existing multi-hand remote unit 202(M) is configured to communicate the respective combined downlink RF communications signal 204 and the respective combined uplink RF communications signal 206 in 1700 MHz, 1800 MHz, and 1900 MHz frequency bands.

The existing multi-band remote units 202(1)-202(M) are communicatively coupled to a central unit 208 via a number of communications mediums 210(1)-210(M), which can be optical-fiber based communications mediums, as an example. The central unit 208 may be communicatively coupled to a signal source 212, such as a digital baseband unit (BM), as an example. The signal source 212 can be configured to distribute one or more first encapsulated downlink digital communications signals 214(1)-214(K) to the central unit 208. Each of the first encapsulated downlink digital communications signals 214(1)-214(K) may be encapsulated based on common public radio interface (CPRI) protocol and corresponds to one or more of the frequency bands $B_1$-$B_N$. For example, the first encapsulated downlink digital communications signals 214(1)-214(K) may collectively correspond to the 700 MHz, 850 MHz, 1700 MHz, 1800 MHz, and 1900 MHz frequency, bands, as mentioned above.

The central unit 208 may be configured to decapsulate the first encapsulated downlink digital communications signals 214(1)-214(K) to extract frequency band information.

Accordingly, the central unit 208 may generate a number of second encapsulated downlink digital communications signals 216(1)-216(M) corresponding to the frequency bands combinations of the existing multi-band remote units 202(1)-202(M), respectively. For example, the second encapsulated downlink digital communications signal 216(1) can be associated with the 700 MHz and the 850 MHz frequency bands, and the second encapsulated downlink digital communications signal 216(M) can be associated with the 1700 MHz, the 1800 MHz, and the 1900 MHz frequency bands. Like the first encapsulated downlink digital communications signals 214(1)-214(K), the second encapsulated downlink digital communications signals 216(1)-216(M) may also be encapsulated based on the CPRI protocol.

Each of the existing multi-band remote units 202(1)-202(M) includes a digital interface circuit 218 (denoted as "interface"), a number of band modules 220(1)-220(N), and an antenna combiner/splitter circuit 222 (denoted as "combiner"). The digital interface circuit 218 is configured to receive a respective second encapsulated downlink digital communications signal among the second encapsulated downlink digital communications signals 216(1)-216(M). For example, the digital interface circuit 218 in the existing multi-hand remote unit 202(1) receives the second encapsulated downlink digital communications signal 216(1), and the digital interface circuit 218 in the existing multi-hand remote unit 202(M) receives the second encapsulated downlink digital communications signals 216(M).

The digital interface circuit 218 in each of the existing multi-band remote units 202(1)-202(M) decapsulates the respective second encapsulated downlink digital communications signal among the second encapsulated downlink digital communications signals 216(1)-216(M) and generates a number of encapsulated band-specific downlink digital communications signals 224(1)-224(N) corresponding to the frequency bands $B_1$-$B_N$, respectively. For example, the digital interface circuit 218 in the existing multi-band remote unit 202(1) decapsulates the second encapsulated downlink digital communications signal 216(1) and generates the encapsulated band-specific downlink digital communications signals 224(1)-224(N) associated with the 700 MHz band and the 850 MHz band, respectively. The band modules 220(1)-220(N) in each of the existing multi-band remote units 202(1)-202(M) are configured to convert the respective encapsulated band-specific downlink digital communications signals 224(1)-224(N) into a number of downlink RF communications signals 226(1)-226(N), respectively. The antenna combiner/splitter circuit 222 in each of the existing multi-band remote units 202(1)-202(M) can be configured to combine the respective downlink RF communications signals 226(1)-226(N) to generate the respective combined downlink RF communications signal 204 for transmission in the respective frequency bands $B_1$-$B_N$.

The antenna combiner/splitter circuit 222 in each of the existing multi-band remote units 202(1)-202(M) can be further configured to receive the respective combined uplink RF communications signal 206 in the respective frequency bands $B_1$-$B_N$. The antenna combiner/splitter circuit 222 may split the respective combined uplink RF communications signal 206 to generate a number of uplink RF communications signals 228(1)-228(N) corresponding to the respective frequency bands $B_1$-$B_N$, respectively. The band modules 220(1)-220(N) in each of the existing multi-band remote units 202(1)-202(M) can be configured to convert the respective uplink RF communications signals 228(1)-228(N) into a number of encapsulated band-specific uplink digital communications signals 230(1)-230(N), respectively.

The digital interface circuit 218 in each of the existing multi-band remote units 202(1)-202(M) can be configured to decapsulate the encapsulated band-specific uplink digital communications signals 230(1)-230(N), which may be encapsulated based on the CPRI protocol, to extract frequency band information. Accordingly, the digital interface circuit 218 in the existing multi-band remote units 202(1)-202(M) collectively generates a number of second encapsulated uplink digital communications signals 232(1)-232(M). The central unit 208 may receive and decapsulate the second encapsulated uplink digital communications signals 232(1)-232(M) to extract frequency band information. Accordingly, the central unit 208 may generate a number first encapsulated uplink digital communications signals 234(1)-234(K) based on the second encapsulated uplink digital communications signals 232(1)-232(M). The central unit 208 may provide the first encapsulated uplink digital communications signals 234(1)-234(K) to the signal source 212.

FIG. 28 is a schematic diagram providing an exemplary detailed illustration of any of the existing multi-band remote units 202(1)-202(M) in the existing WCS 200 of FIG. 2A. For the convenience of reference and illustration, the existing multi-band remote unit 202(1) in the existing WCS 200 is discussed herein as a non-limiting example. Common elements between FIGS. 2A and 28 are shown therein with common element numbers and will not be re-described herein.

The digital interface circuit 218 includes an encapsulation/decapsulation circuit 236 and a routing circuit 238. The encapsulation/decapsulation circuit 236 may be configured to receive and decapsulate the second encapsulated downlink digital communications signal 216(1) to extract frequency band information. The routing circuit 238 may be configured to generate the encapsulated band-specific downlink digital communications signals 224(1)-224(N) corresponding to the frequency bands $B_1$-$B_N$, respectively. In a non-limiting example, the encapsulated band-specific downlink digital communications signals 224(1)-224(N) can be based on the CPRI protocol as well. The routing circuit 238 may subsequently route the encapsulated band-specific downlink digital communications signals 224(1)-224(N) to the band modules 220(1)-220(N), respectively.

The band modules 220(1)-220(N) include a number of digital processing circuits 240(1)-240(N) and a number of RF front-end circuits 242(1)-242(N), respectively. The digital processing circuits 240(1)-240(N) include a number of band-specific encapsulation/decapsulation circuits 244(1)-244(N), a number of crest factor reduction (CFR) circuits 246(1)-246(N), and a number of digital pre-distortion (DPD) circuits 248(1)-248(N), respectively. The band-specific encapsulation/decapsulation circuits 244(1)-244(N) are configured to decapsulate the encapsulated band-specific downlink digital communications signal 224(1)-224(N) to generate a number of downlink digital communications signals 250(1)-250(N), respectively. The CFR circuits 246(1)-246(N) and the DPD circuits 248(1)-248(N) are configured to digitally pre-process the downlink digital communications signals 250(1)-250(N), respectively.

The RF front-end circuits 242(1)-242(N) include a number of digital-to-analog converters (DACs) 252(1)-252((N), a number of downlink frequency conversion circuits 254(1)-254(N), and a number of power amplifiers 256(1)-256(N), respectively. The DACs 252(1)-252(N) are configured to convert the downlink digital communications signals 250(1)-250(N) into a number of downlink intermediate frequency (IF) communications signals 258(1)-258(N), respectively. The downlink frequency conversion circuits 254(1)-254(N) are configured to convert the downlink IF communications signals 258(1)-258(N) into the downlink RF communications signals 226(1)-226(N), respectively. The power amplifiers 256(1)-256(N) are configured to amplify the downlink RF communications signals 226(1)-226(N), respectively. The power amplifiers 256(1)-256(N) are configured to provide the downlink RF communications signals 226(1)-226(N) to the antenna combiner/splitter circuit 222 via a number of couplers 260(1)-260(N), respectively.

The RF front-end circuits 242(1)-242(N) include a number of uplink frequency conversion circuits 262(1)-262(N) (denoted as "RF/IF" in FIG. 28) and a number of analog-to-digital converters (ADCs) 264(1)-264(N), respectively. The uplink frequency conversion circuits 262(1)-262(N) are configured to convert the uplink RF communications signals 228(1)-228(N) into a number of uplink IF communications signals 266(1)-266(N), respectively. The ADCs 264(1)-264(N) are configured to convert the uplink IF communications signals 266(1)-266(N) into a number of uplink digital communications signals 268(1)-268(N), respectively. The band-specific encapsulation/decapsulation circuits 244(1)-244(N) are configured to encapsulate the uplink digital communications signals 268(1)-268(N) to generate the encapsulated band-specific uplink digital communications signals 230(1)-230(N), respectively.

The RF front-end circuits 242(1)-242(N) further include a number of DPD feedback paths 270(1)-270(N) coupled between the couplers 260(1)-260(N) and the DPD circuits 248(1)-248(N), respectively. The DPD feedback paths 270(1)-270(N) are configured to provide a number of digital feedback signals 272(1)-272(N) to the DPD circuits 248(1)-248(N), respectively. The DPD feedback paths 270(1)-270(N) include a number of DPD feedback frequency conversion circuits 274(1)-274(N) (denoted as "RF/IF") and a number of feedback ADCs 276(1)-276(N), respectively. The DPD feedback frequency conversion circuits 274(1)-274(N) are configured to convert the downlink RF communications signals 226(1)-226(N) into a number of IF feedback signals 278(1)-278(N), respectively. The feedback ADCs 276(1)-276(N) are configured to convert the IF feedback signals 278(1)-278(N) into the digital feedback signals 272(1)-272(N), respectively. Accordingly, the DPD circuits 248(1)-248(N) may digitally pre-distort the downlink digital communications signals 250(1)-250(N) based on the digital feedback signals 272(1)-272(N), respectively.

In a non-limiting example, the CFR circuits 246(1)-246(N) are configured to reduce peak-to-average ratios (PARs) of the downlink digital communications signals 250(1)-250(N), respectively. The DPD circuits 248(1)-248(N) are configured to digitally pre-distort the downlink digital communications signals 250(1)-250(N) to compensate for nonlinear distortions that may result from the power amplifiers 256(1)-256(N), respectively. As such, the digital processing circuits 240(1)-240(N) are critical to improving efficiency of the power amplifiers 256(1)-256(N), and thus the performance of the existing multi-band remote unit 202(1).

However, each of the digital processing circuits 240(1)-240(N) is only configured to pre-process a respective downlink communications signal in a respective frequency hand. In this regard, a total number of the digital processing circuits 240(1)-240(N) equals a total number of the frequency bands $B_1$-$B_N$ to be supported by the existing multi-band remote unit 202(1). In a non-limiting example, each of the digital processing circuits 240(1)-240(N) can be implemented by a field-programmable gate array (FPGA) that can cost approximately $100. As such, a total cost of the existing multi-band remote unit 202(1) may increase significantly when the existing multi-band remote unit 202(1) is configured to support an increased number of frequency bands. In addition, adding additional digital processing circuits into the existing multi-band remote unit 202(1) may also lead to an increased power consumption, thus creating potential issues in heat dissipation. As such, it may be desirable to reduce the number of the digital processing circuits 240(1)-240(N) in the existing multi-hand remote unit 202(1).

Figure 3:
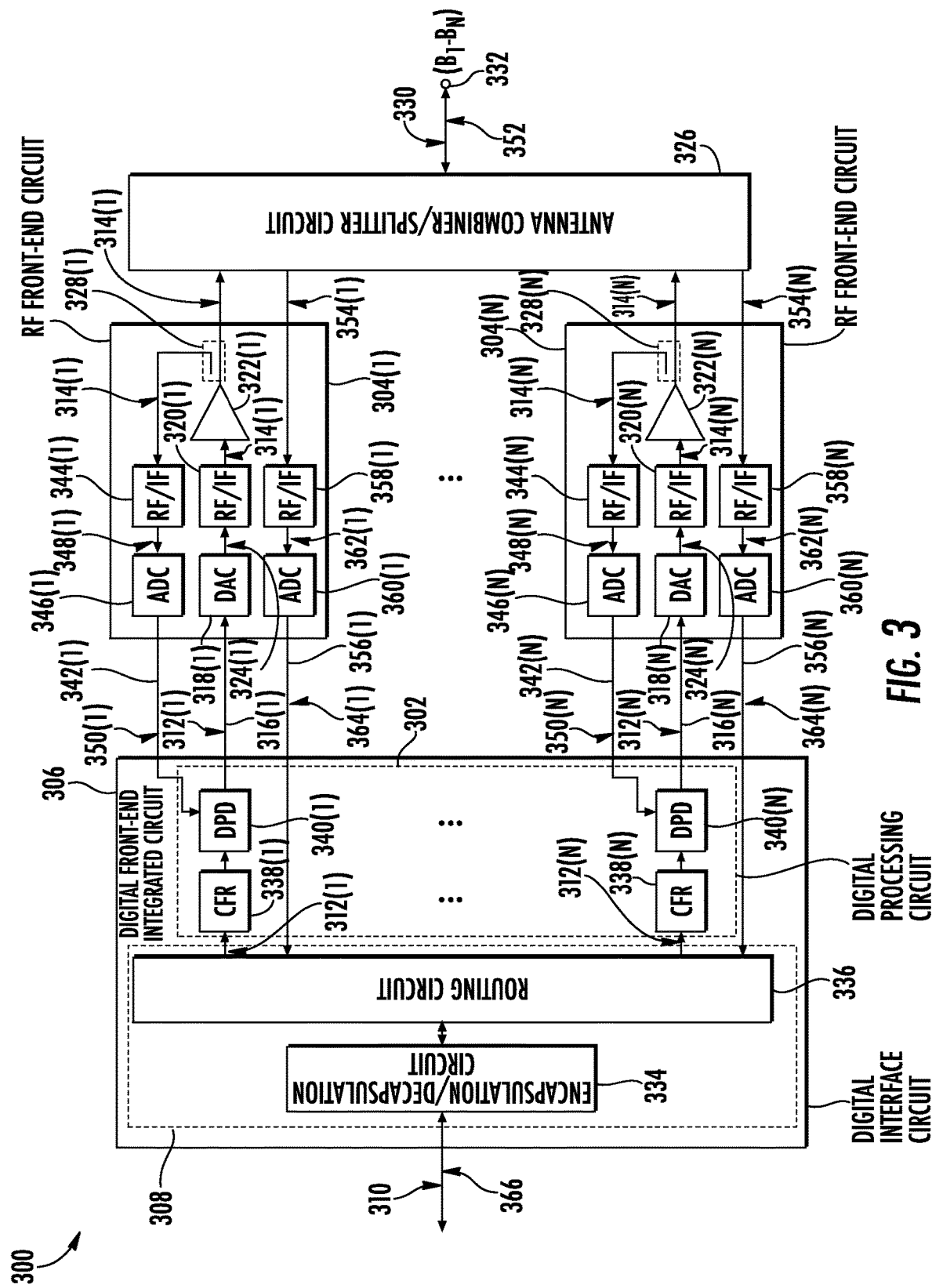
FIG. 3 is a schematic diagram of an exemplary multi-band remote unit configured according to an embodiment of the present disclosure to share a digital processing circuit among a number of radio frequency (RF) front-end circuits to help reduce cost and/or power consumption of the multi-band remote unit.

In this regard, FIG. 3 is a schematic diagram of an exemplary multi-band remote unit 300 configured according to an embodiment of the present disclosure to share a digital processing circuit 302 among a number of RF front-end circuits 304(1)-304(N) to help reduce cost and/or power consumption of the multi-band remote unit 300. In a non-limiting example, the digital processing circuit 302 is provided in a digital front-end IC 306, while the RF front-end circuits 304(1)-304(N) are provided outside the digital front-end. IC 306. In this regard, the RF front-end circuits 304(1)-304(N) are said to be separated from the digital front-end IC 306, and thus the digital processing circuit 302. As discussed in detail below, the RF front-end circuits 304(1)-304(N) are configured to share the digital processing circuit 302, as opposed to requiring multiple digital processing circuits as in the existing multi-band remote unit 202(1) of FIG. 28. As such, it may be possible for the multi-hand remote unit 300 to support a number of frequency bands $B_1$-$B_N$ with reduced cost and/or power consumption.

Figure 2B:
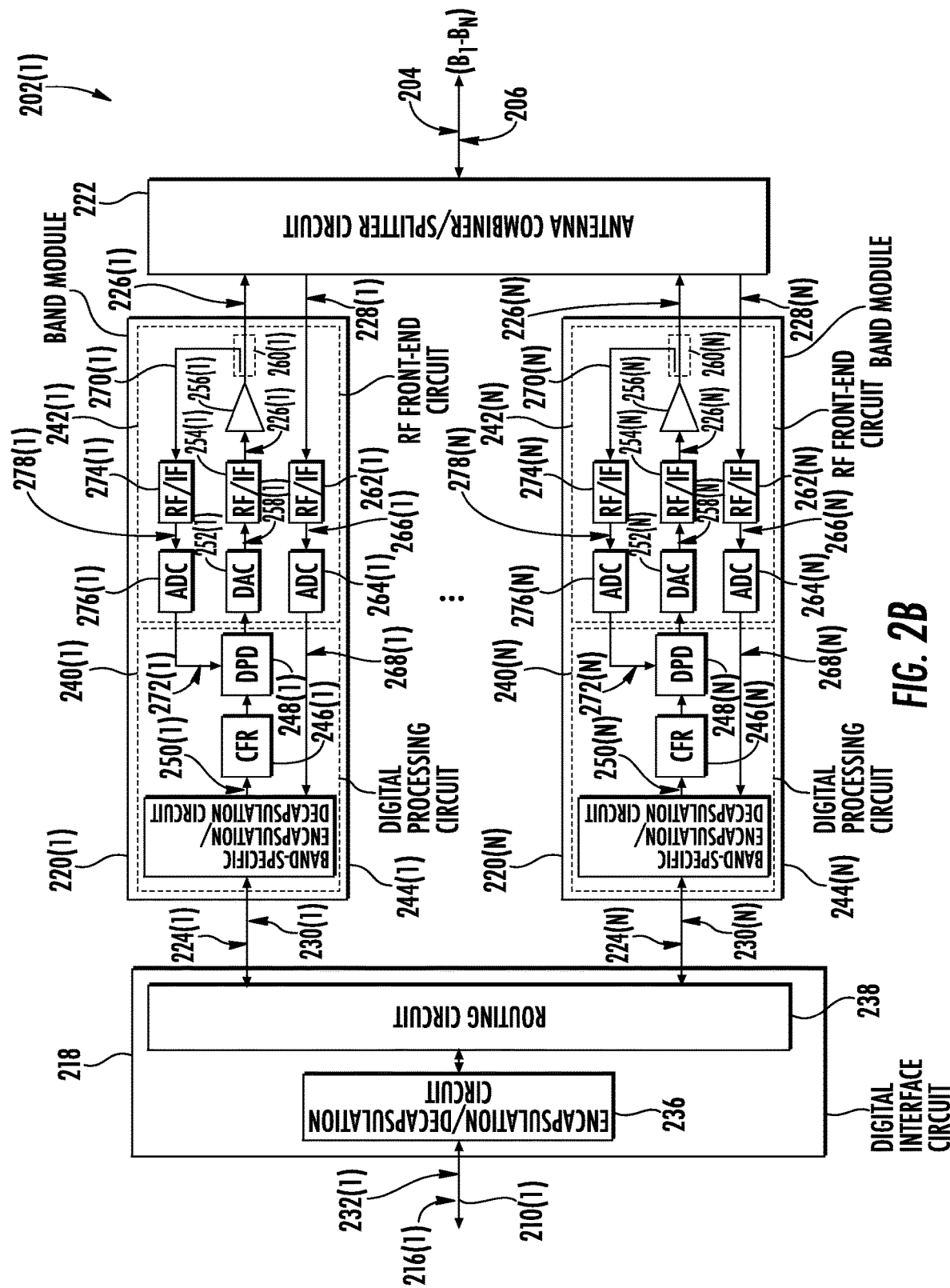
FIG. 2B is a schematic diagram providing an exemplary detailed illustration of any of the existing multi-band remote units in the WCS of FIG. 2A.

In addition to the digital processing circuit 302, the digital front-end IC 306 may also include a digital interface circuit 308. The digital interface circuit 308 can be configured to receive an encapsulated downlink digital communications signal 310 corresponding to the frequency bands $B_1$-$B_N$ and generate a number of downlink digital communications signals 312(1)-312(N) associated with the frequency bands $B_1$-$B_N$, respectively, based on the encapsulated downlink digital communications signal 310. The digital processing circuit 302 can be configured to receive and digitally process the downlink digital communications signals 312(1)-312(N) before providing the downlink digital communications signals 312(1)-312(N) to the RF front-end circuits 304(1)-304(N), respectively. In a non-limiting example, the digital front-end IC 306 can be programmably enabled by a single FPGA, thus helping to reduce overall cost of the multi-band remote unit 300 compare to the existing multi-band remote unit 202(1) in FIG. 2B, which has to employ multiple FPGAs for supporting multiple frequency bands.

The RF front-end circuits 304(1)-304(N) are configured to convert the downlink digital communications signals 312(1)-312(N) into number of downlink RF communications signals 314(1)-314(N) for transmission in the frequency hands $B_1$-$B_N$, respectively. The RF front-end circuits 304(1)-304(N) include a number of downlink paths 316(1)-316(N), respectively. The downlink paths 316(1)-316(N) include a number of DACs 318(1)-318(N), a number of downlink frequency conversion circuits 320(1)-320(N) (denoted as "RF/IF"), and a number of power amplifiers 322(1)-322(N), respectively. The DACs 318(1)-318(N) are coupled to the digital processing circuit 302 and configured to convert the downlink digital communications signals 312(1)-312(N) into a number of downlink IF communications signals 324(1)-324(N), respectively. The downlink frequency conversion circuits 320(1)-320(N) are configured to convert the downlink IF communications signals 324(1)-324(N) into the downlink RF communications signals 314(1)-314(N), respectively. The power amplifiers 322(1)-322 (N) are configured to amplify the downlink RF communications signals 314(1)-314(N) for transmission in the frequency bands $B_1$-$B_N$, respectively.

The multi-band remote unit 300 includes an antenna combiner/splitter circuit 326 that is coupled to the power amplifiers 322(1)-322(N) via a number of couplers 328(1)-328(N), respectively. The antenna combiner/splitter circuit 326 is configured to combine the downlink RF communications signals 314(1)-314(N) to generate a combined downlink RF communications signal 330 for transmission in the frequency bands $B_1$-$B_N$ via an antenna port 332.

The digital interface circuit 308 includes an encapsulation/decapsulation circuit 334 and a routing circuit 336. The encapsulation/decapsulation circuit 334 is configured to receive the encapsulated downlink digital communications signal 310 from a central unit (not shown). The encapsulation/decapsulation circuit can be configured to decapsulate the encapsulated downlink digital communications signal 310 to extract information related to the frequency bands $B_1$-$B_N$. The routing circuit 336 is configured to generate the downlink digital communications signals 312(1)-312(N) corresponding to the frequency bands $B_1$-$B_N$, respectively, and route the downlink digital communications signals 312(1)-312(N) to the digital processing circuit 302.

In a non-limiting example, the digital processing circuit 302 includes a number of CFR circuits 338(1)-338(N) and a number of DPD circuits 340(1)-340(N). The CFR circuits 338(1)-338(N) are configured to reduce PARs of the downlink digital communications signals 312(1)-312(N). The DPD circuits 340(1)-340(N) are coupled to the CFR circuits 338(1)-338(N) and configured to digitally pre-distort the downlink digital communications signals 312(1)-312(N) to compensate for nonlinear distortions associated with the power amplifiers 322(1)-322(N), respectively. The DPD circuits 340(1)-340(N) are further configured to provide the pre-distorted downlink digital communications signals 312(1)-312(N) to the DACs 318(1)-318(N), respectively. As mentioned earlier, the digital front-end IC 306 can be enabled by an FPGA. As such, the DPD circuits 340(1)-340(N) can be coupled to the DACs 318(1)-318(N) via JESD204 interfaces and provide the pre-distorted downlink digital communications signals 312(1)-312(N) to the DACs 318(1)-318(N) in the form of downlink hit streams. Collectively, the CFR circuits 338(1)-338(N) and the DPD circuits 340(1)-340(N) can digitally process the downlink digital communications signals 312(1)-312(N) to help improve efficiency of the power amplifiers 322(1)-322(N).

Although the digital processing circuit 302 is shown to include the CFR circuits 338(1)-338(N) and the DPD circuits 340(1)-340(N) that correspond to the RF front-end circuits 304(1)-304(N), respectively, it should be appreciated that it may also be possible for the multi-band remote unit 300 to employ a lesser number of CFR circuits 338(1)-338(N) and/or DPD circuits 340(1)-340(N) than the RF front-end circuits 304(1)-304(N). For example, given that the digital front-end IC 306 can be enabled by programming the FPGA, it may be possible to programmably configure a single CFR circuit and/or a single DPD circuit in the digital front-end IC 306 to support all of the RF front-end circuits 304(1)-304(N).

To enable the DPD circuits 340(1)-340(N) to digitally pre-distort the downlink digital communications signals 312(1)-312(N), the multi-band remote unit 300 also includes a number of DPD feedback paths 342(1)-342(N), which are coupled between the DPD circuits 340(1)-340(N) and the couplers 328(1)-328(N), respectively. The DPD feedback paths 342(1)-342(N) include a number of feedback frequency conversion circuits 344(1)-344(N) and a number of feedback ADCs 346(1)-346(N), respectively. The feedback frequency conversion circuits 344(1)-344(N) are coupled to the couplers 328(1)-328(N) and configured to convert the downlink RF communications signals 314(1)-314(N) into a number of IF feedback signals 348(1)-348(N), respectively. The feedback ADCs 346(1)-346(N) are coupled to the DPD circuits 340(1)-340(N) and configured to convert the IF feedback signals 348(1)-348(N) into a number of digital feedback signals 350(1)-350(N), respectively. Accordingly, the DPD circuits 340(1)-340(N) can digitally pre-distort the downlink digital communications signals 312(1)-312(N) based on the digital feedback signals 350(1)-350(N), respectively. The digital feedback signals 350(1)-350(N) may be provided from the feedback ADCs 346(1)-346(N) to the DPD circuits 340(1)-340(N) via the JESD204 interfaces and in the form of feedback bit streams.

The antenna combiner/splitter circuit 326 can be configured to receive a combined uplink RF communications signal 352 corresponding to the frequency bands $B_1$-$B_N$ via the antenna port 332. The antenna combiner/splitter circuit 326 is configured to split the combined uplink RF communications signal 352 to generate a number of uplink RF communications signals 354(1)-354(N) corresponding to the frequency bands $B_1$-$B_N$, respectively. The multi-band remote unit 300 includes a number of uplink paths 356(1)-356(N) coupled between the antenna combiner/splitter circuit 326 and the routing circuit 336. The uplink paths 356(1)-356(N) include a number of uplink frequency conversion circuits 358(1)-358(N) and a number of ADCs 360(1)-360(N), respectively. The uplink frequency conversion circuits 358(1)-358(N) are configured to convert the uplink RF communications signals 354(1)-354(N) into a number of uplink IF communications signals 362(1)-362(N), respectively. The ADCs 360(1)-360(N) are configured to convert the uplink IF communications signals 362(1)-362(N) into a number of uplink digital communications signals 364(1)-364(N), respectively. Subsequently, the ADCs 360(1)-360(N) provide the uplink digital communications signals 364(1)-364(N) to the routing circuit 336, for example, via the JESD204 interfaces and in the form of uplink bit streams.

The routing circuit 336 is configured to receive and provide the uplink digital communications signals 364(1)-364(N) to the encapsulation/decapsulation circuit 334. The encapsulation/decapsulation circuit 334 may be configured to encapsulate the uplink digital communications signals 364(1)-364(N) to generate an encapsulated uplink digital communications signal 366. Accordingly, the encapsulation/decapsulation circuit 334 may provide the encapsulated uplink digital communications signal 366 to the central unit 208.

Figure 4A:
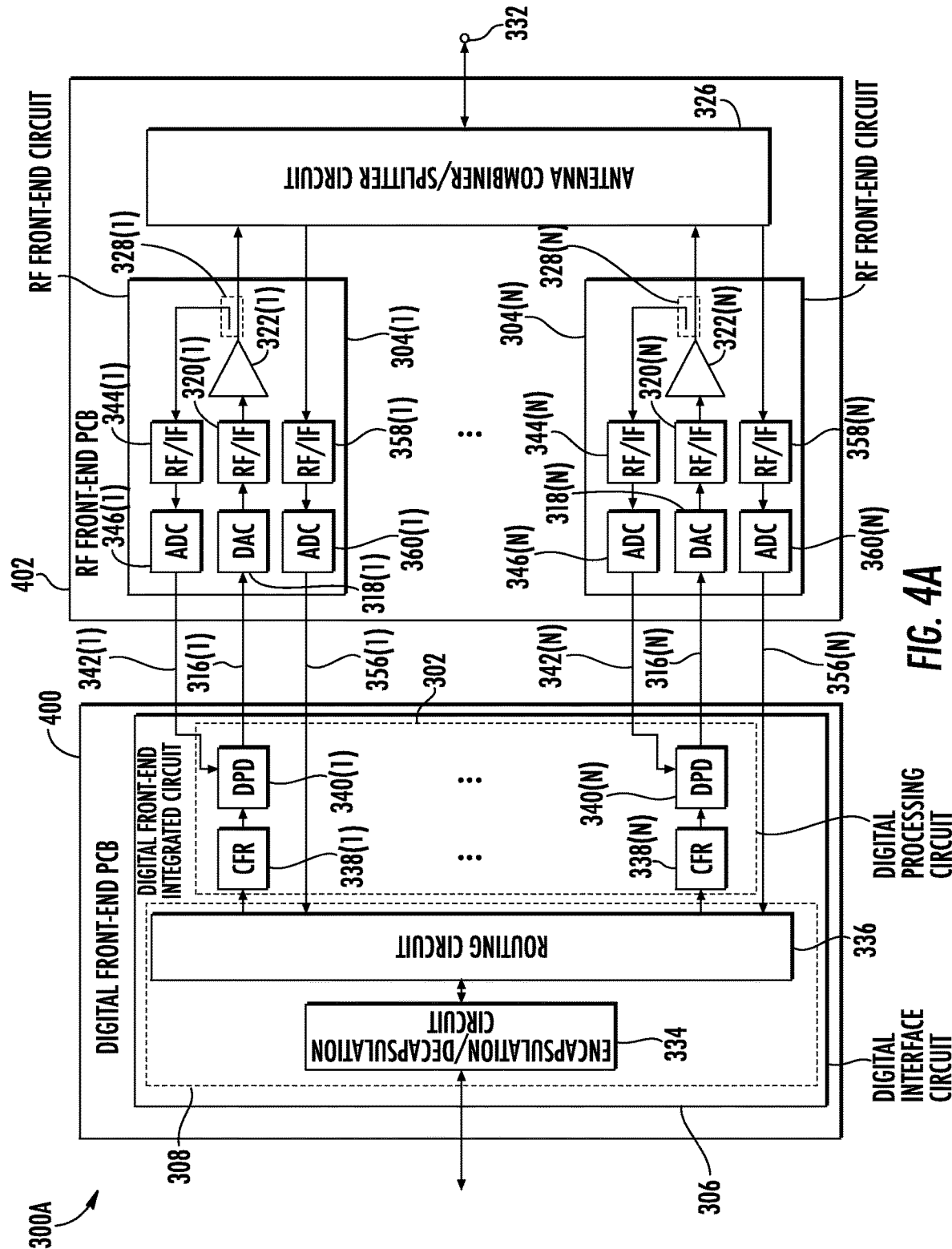
FIG. 4A is a schematic diagram of an exemplary multi-band remote unit configured according to an embodiment of the present disclosure to include a digital front-end printed circuit board (PCB) and an RF front-end PCB.

Alternative to providing the digital processing circuit 302 in an IC and providing the RF front-end circuits 304(1)-304(N) outside the IC, it may also be possible to provide the digital processing circuit 302 in a digital front-end printed circuit board (PCB) and provide the RF front-end circuits 304(1)-304(N) in a different PCB(s). In this regard, FIG. 4A is a schematic diagram of an exemplary multi-band remote unit 300A configured according to an embodiment of the present disclosure to include a digital front-end PCB 400 and an RF front-end PCB 402. Common elements between FIGS. 3 and 4A are shown therein with common element numbers and will not be re-described herein.

As shown in FIG. 4A, the digital front-end PCB 400 and the RF front-end PCB 402 are different PCBs that are separated from each other. The digital front-end PCB 400 is configured to include the digital front-end IC 306, which includes the digital interface circuit 308 and the digital processing circuit 302. The RF front-end PCB 402 is configured to include the RF front-end circuits 304(1)-304(N) and the antenna combiner/splitter circuit 326.

Figure 4B:
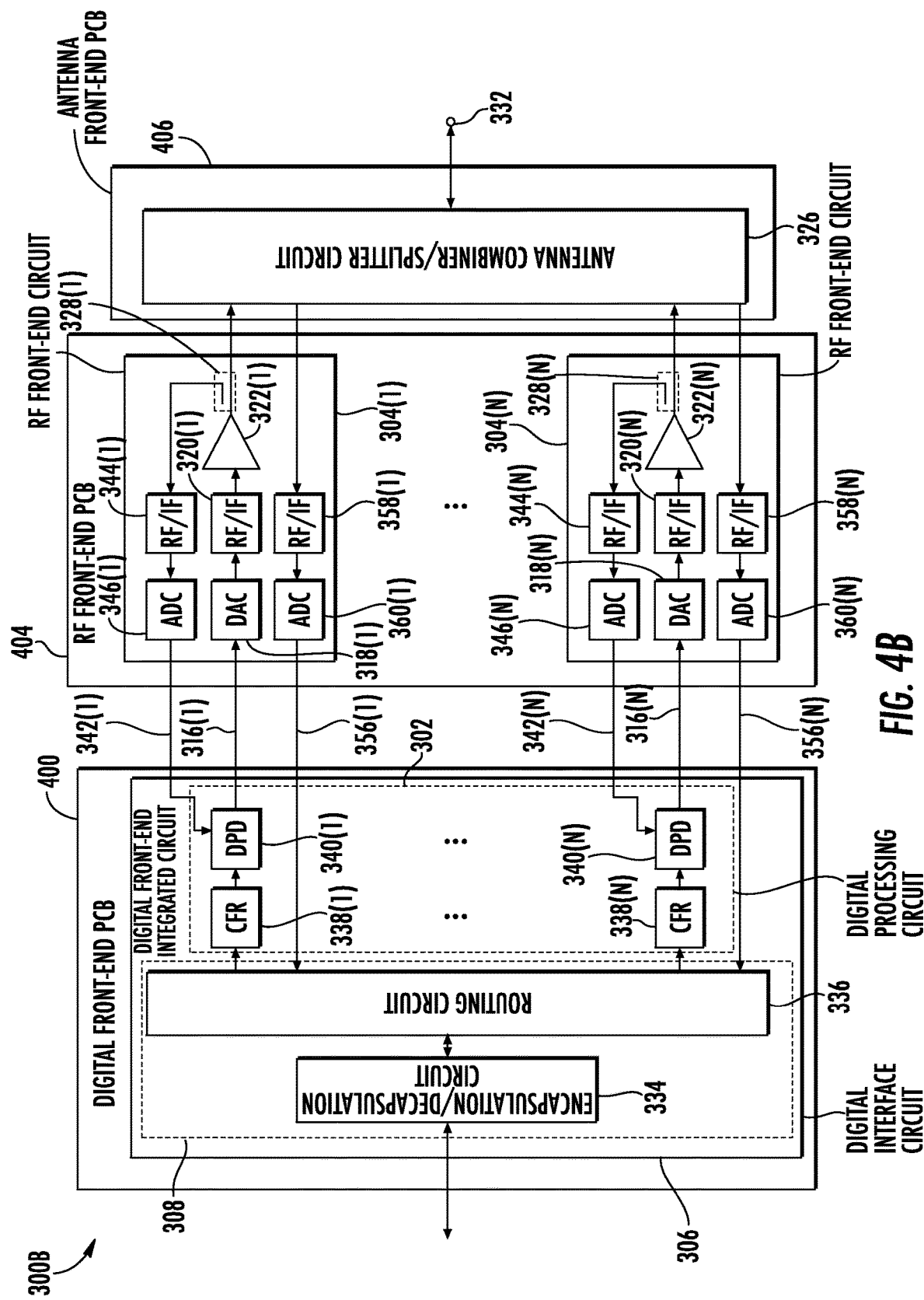
FIG. 4B is a schematic diagram of an exemplary multi-band remote unit configured according to another embodiment of the present disclosure to include a digital front-end PCB, an RF front-end PCB, and an antenna front-end PCB.

FIG. 4B is a schematic diagram of an exemplary multi-band remote unit 300B configured according to another embodiment of the present disclosure to include the digital front-end PCB 400 of FIG. 4A, an RF front-end PCB 404, and an antenna front-end PCB 406. Common elements between FIGS. 4A and 4B are shown therein with common element numbers and will not be re-described herein.

As shown in FIG. 4B, the digital front-end PCB 400, the RF front-end. PCB 404, and the antenna front-end PCB 406 are different PCBs that are separated from each other. The RF front-end PCB 404 is configured to include the RF front-end circuits 304(1)-304(N), and the antenna front-end PCB 406 is configured to include the antenna combiner/splitter circuit 326.

Figure 4C:
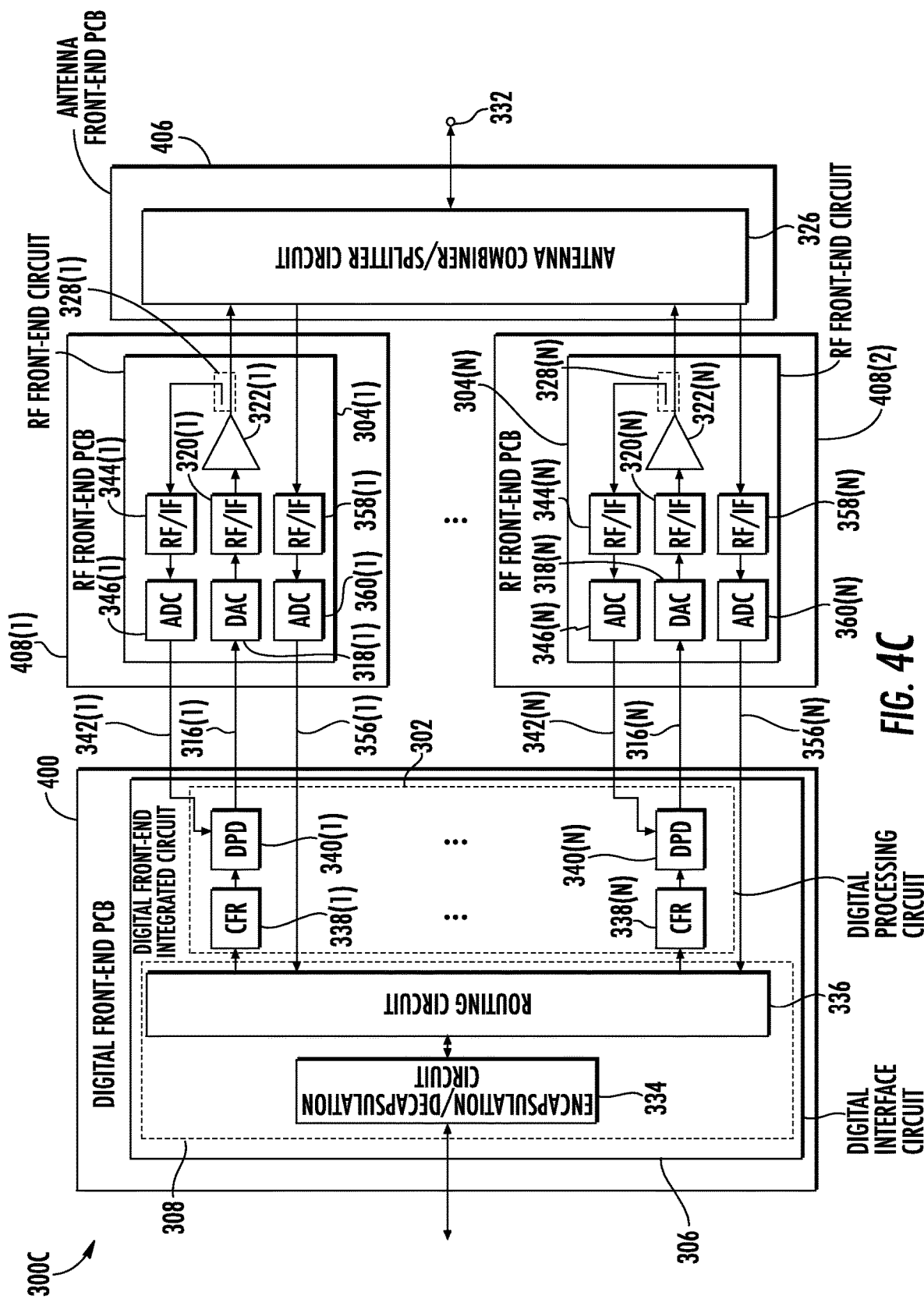
FIG. 4C is a schematic diagram of an exemplary multi-band remote unit configured according to another embodiment of the present disclosure to include a digital front-end PCB, a number of RF front-end PCBs, and an antenna front-end PCB.

FIG. 4C is a schematic diagram of an exemplary multi-band remote unit 300C configured according to another embodiment of the present disclosure to include the digital front-end PCB 400 of FIG. 4B, a number of RF front-end PCBs 408(1)-408(N), and the antenna front-end PCB 406 of FIG. 4B. Common elements between FIGS. 4B and 4C are shown therein with common element numbers and will not be re-described herein.

As shown in FIG. 4C, the digital front-end PCB 400, the RF front-end PCBs 408(1)-408(N), and the antenna front-end PCB 406 are different PCBs that are separated from each other. The RF front-end PCBs 408(1)-408(N) are configured to include the RF front-end circuits 304(1)-304(N), respectively.

Although the digital front-end PCB 400, the RF front-end PCB 404, and the antenna front-end PCB 406 in FIGS. 4A-4C are provided as different PCBs that are separated from each other, it should be appreciated that it may also be possible to provide the digital front-end PCB 400, the RF front-end PCB 404, and the antenna front-end PCB 406 in a single PCB. In a non-limiting example, the cost saving benefit can be achieved as long as the multi-band remote unit 300 of FIG. 3 is configured to have a lesser number of FPGAs than a number of the RF front-end circuits 304(1)-304(N).

Figure 5:
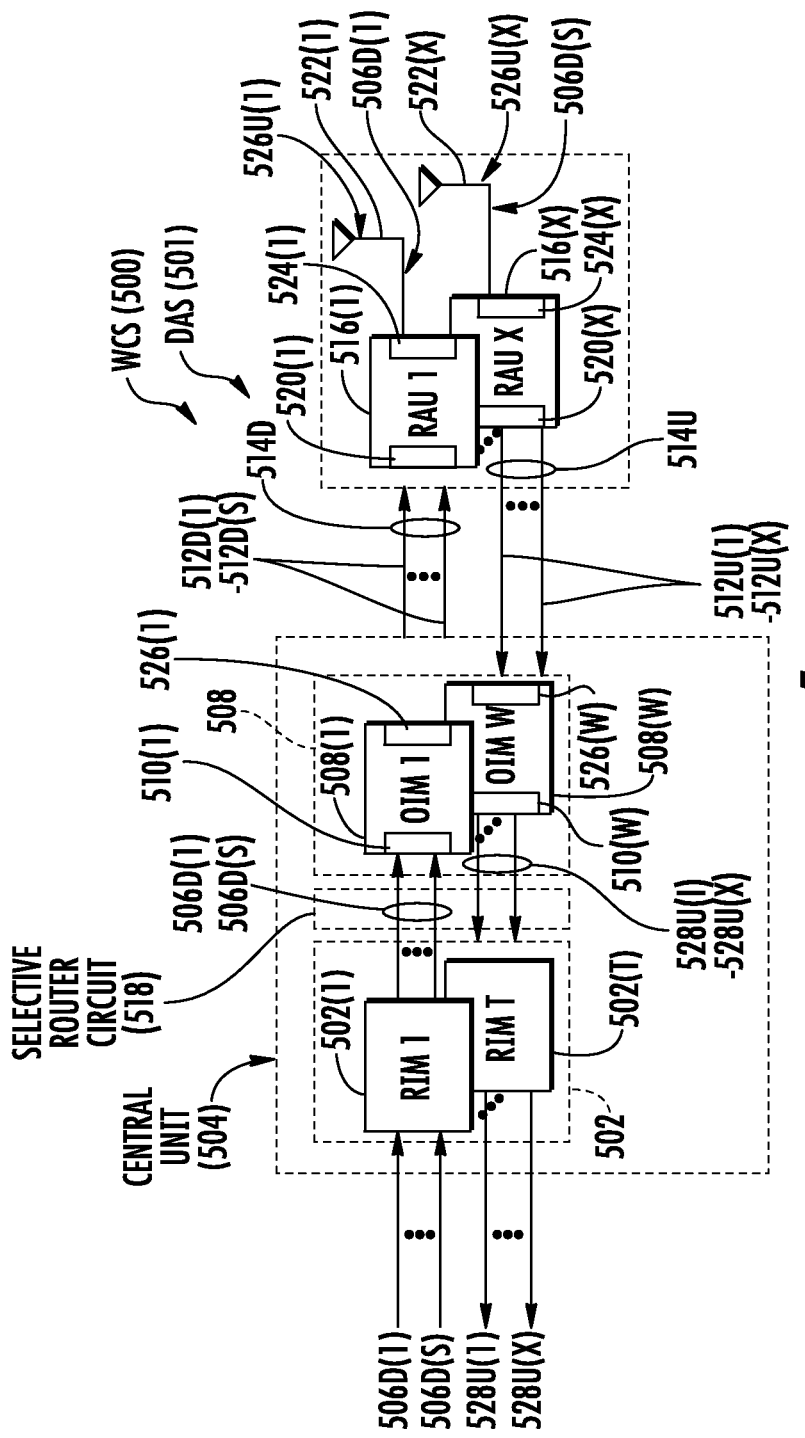
FIG. 5 is a schematic diagram of an exemplary WCS provided in the form of an optical fiber-based DAS that is configured to include the multi-band remote units of FIGS. 3 and 4A-4C.

FIG. 5 is a schematic diagram of such an exemplary WCS 500 in the form of a DAS 501. The DAS 501 in this example is an optical fiber-based DAS. The DAS 501 in this example is comprised of three (3) main components. One or more radio interfaces provided in the form of radio interface modules (RIMs) 502(1)-502(T) are provided in a central unit 504 to receive and process downlink electrical communications signals 506D(1)-506D(S) prior to optical conversion into downlink optical communications signals. The downlink electrical communications signals 506D(1)-506D(S) may be received from a base station (not shown) as an example. The downlink electrical communications signals 506D(1)-506D(S) can each include one or more subcarrier sets of a cell radio, wherein each subcarrier set is comprised of one or more subcarriers (e.g., radio channels). The RIMs 502(1)-502(T) provide both downlink and uplink interfaces for signal processing. The notations "1-S" and "1-T" indicate that any number of the referenced component, 1-S and 1-T, respectively, may be provided.

With continuing reference to FIG. 5, the central unit 504 is configured to accept the plurality of RIMs 502(1)-502(T) as modular components that can easily be installed and removed or replaced in the central unit 504. In one embodiment, the central unit 504 is configured to support up to twelve (12) RIMs 502(1)-502(12). Each RIM 502(1)-502(T) can be designed to support a particular type of radio source or range of radio sources frequencies) to provide flexibility in configuring the central unit 504 and the DAS 501 to support the desired radio sources. For example, one RIM 502 may be configured to support the Personal Communication Services (PCS) radio band. Another RIM 502 may be configured to support the 700 MHz radio band. In this example, by inclusion of these RIMs 502, the central unit 504 could be configured to support and distribute communications signals, including those for the communications services and communications bands described above as examples.

The RIMs 502(1)-502(T) may be provided in the central unit 504 that support any frequencies desired, including but not limited to licensed US FCC and Industry Canada frequencies (824-849 MHz on uplink and 869-894 MHz on downlink), US FCC and Industry Canada frequencies (1850-1915 MHz on uplink and 1930-1995 MHz on downlink), US FCC and Industry Canada frequencies (1710-1755 MHz on uplink and 2110-2155 MHz on downlink), US FCC frequencies (698-716 MHz and 776-787 MHz on uplink and 728-746 MHz on downlink), EU R & TTE frequencies (880-915 MHz on uplink and 925-960 MHz on downlink), EU R & TIE frequencies (1710-1785 MHz on uplink and 1805-1880 MHz on downlink), EU R & TTE frequencies (1920-1980 MHz on uplink and 2110-2170 MHz on downlink), US FCC frequencies (806-824 MHz on uplink and 851-869 MHz on downlink), US FCC frequencies (896-901 MHz on uplink and 929-941 MHz on downlink), US FCC frequencies (793-805 MHz on uplink and 763-775 MHz on downlink), and US FCC frequencies (2495-2690 MHz on uplink and downlink).

With continuing reference to FIG. 5, the downlink electrical communications signals 506D(1)-506D(S) may be distributed to a plurality of optical interfaces provided in the form of optical interface modules (OIMs) 508(1)-508(W) in this embodiment to convert the unlicensed and/or licensed downlink electrical communications signals 506D(1)-506D(S). The notation "1-W" indicates that any number of the referenced component 1-W may be provided. The OIMs 508(1)-508(W) may be configured to provide one or more optical interface components (OICs) that contain optical-to-electrical (O-E) and electrical-to-optical (E-O) converters, as will be described in more detail below. The OIMs 508(1)-508(W) support the radio bands that can be provided by the RIMs 502(1)-502(T), including the examples previously described above.

The OIMs 508(1)-508(W) each include E-O converters 510(1)-510(W) to convert the downlink electrical communications signals 506D(1)-506D(S) into downlink optical communications signals 512D(1)-512D(S). The downlink optical communications signals 512D(1)-512D(S) are communicated over downlink optical fiber communications medium 514D to a plurality of remote units, such as the multi-band remote unit 300 of FIG. 3, the multi-band remote unit 300A of FIG. 4A, the multi-band remote unit 300B of FIG. 4B, and the multi-band remote unit 300C of FIG. 4C, provided in the form of remote antenna units 516(1)-516(X). A selective router circuit 518 can be provided to selectively block certain subcarrier sets and/or subcarriers in the downlink optical communications signals 512D(1)-512D(S) distributed to the respective remote antenna units 516(1)-516(X) based on subcarriers associated with the respective remote antenna units 516(1)-516(X). The remote antenna units 516(1)-516(X) are arranged with each other based on their supported cell radio. The notation "1-X" indicates that any number of the referenced component 1-X may be provided. O-E converters 520(1)-520(X) provided in the remote antenna units 516(1)-516(X) convert the downlink optical communications signals 512D(1)-512D(S) back into the downlink electrical communications signals 506D(1)-506D(S), which are provided to antennas 522(1)-522(X) in the remote antenna units 516(1)-516(X) to user equipment (not shown) in the reception range of the antennas 522(1)-522(X).

E-O converters 524(1)-524(X) are also provided in the remote antenna units 516(1)-516(X) to convert uplink electrical communications signals 526U(1)-526U(X) received from user equipment (not shown) through the antennas 522(1)-522(X) into uplink optical communications signals 512U(1)-512U(X). The remote antenna units 516(1)-516(X) communicate the uplink optical communications signals 512U(1)-512U(X) over an uplink optical fiber communications medium 514U to the OIMs 508(1)-508(W) in the central unit 504. The OIMs 508(1)-508(W) include O-E converters 526(1)-526(W) that convert the received uplink optical communications signals 512U(1)-512U(X) into uplink electrical communications signals 528U(1)-528U(X), which are processed by the RIMS 502(1)-502(T) and provided as uplink electrical communications signals 528U(1)-528U(X). The central unit 504 may provide the uplink electrical communications signals 528U(1)-528U(X) to a source transceiver, such as a cell radio provided as base station or other communications system. The selective router circuit 518 may be configured to selectively block certain subcarrier sets and/or subcarriers in the uplink electrical communications signals 528U(1)-528U(X) distributed to the respective remote antenna units 516(1)-516(X) based on subcarriers associated with the respective remote antenna units 516(1)-516(X). Note that the downlink optical fiber communications medium 514D and uplink optical fiber communications medium 514U connected to each remote antenna unit 516(1)-516(X) may be a common optical fiber communications medium, wherein for example, wave division multiplexing (WDM) may the employed to provide the downlink optical communications signals 512D(1)-512D(S) and the uplink optical communications signals 512U(1)-512U(X) on the same optical fiber communications medium.

Figure 6:
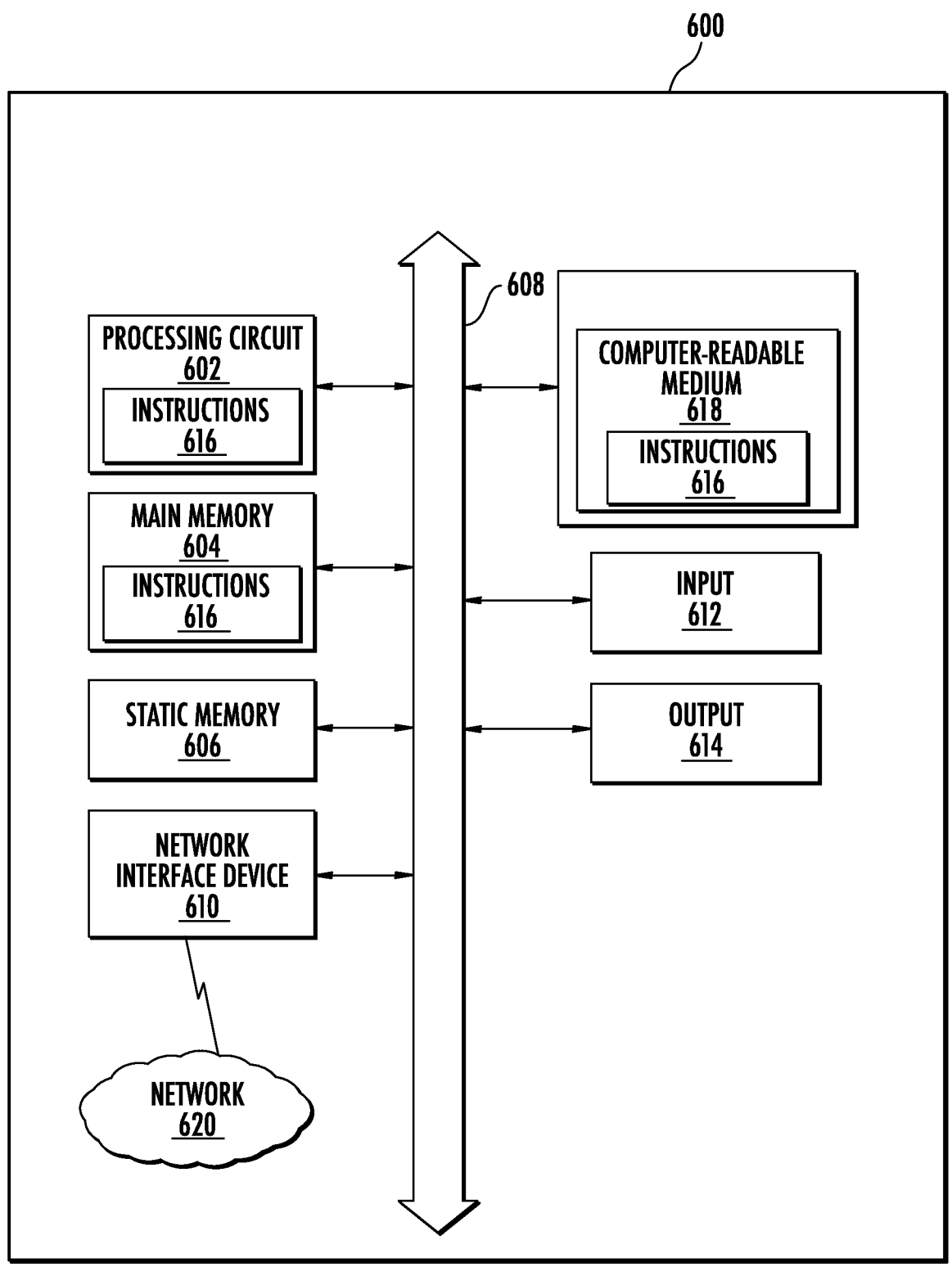
FIG. 6 is a schematic diagram of a representation of an exemplary computer system that can be included in or interface with any of the components in the multi-band remote unit of FIGS. 3 and 4A-4C, wherein the exemplary computer system is configured to execute instructions from an exemplary computer-readable medium.

Any of the circuits in the multi-band remote unit of FIGS. 3 and 4A-4C (e.g., the digital front-end IC 306) can include a computer system 600, such as shown in FIG. 6, to carry out their functions and operations. With reference to FIG. 6, the computer system 600 includes a set of instructions for causing the multi-operator radio node component(s) to provide its designed functionality, and their circuits discussed above. The multi-operator radio node component(s) may be connected (e.g., networked) to other machines in a LAN, an intranet, an extranet, or the Internet. The multi-operator radio node component(s) may operate in a client-server network environment, or as a peer machine in a peer-to-peer (or distributed) network environment. While only a single device is illustrated, the term "device" shall also be taken to include any collection of devices that individually or jointly execute a set (or multiple sets) of instructions to perform any one or more of the methodologies discussed herein. The multi-operator radio node component(s) may be a circuit or circuits included in an electronic board card, such as a printed circuit board (PCB) as an example, a server, a personal computer, a desktop computer, a laptop computer, a personal digital assistant (PDA), a computing pad, a mobile device, or any other device, and may represent, for example, a server, edge computer, or a user's computer. The exemplary computer system 600 in this embodiment includes a processing circuit or processor 602, a main memory 604 read-only memory (ROM), flash memory, dynamic random access memory (DRAM) such as synchronous DRAM (SDRAM), etc.), and a static memory 606 (e.g., flash memory, static random access memory (SRAM), etc.), which may communicate with each other via a data bus 608. Alternatively, the processing circuit 602 may be connected to the main memory 604 and/or static memory 606 directly or via some other connectivity means. The processing circuit 602 may be a controller, and the main memory 604 or static memory 606 may be any type, of memory.

The processing circuit 602 represents one or more general-purpose processing circuits such as a microprocessor, central processing unit, or the like. More particularly, the processing circuit 602 may be a complex instruction set computing (CISC) microprocessor, a reduced instruction set computing (RISC) microprocessor, a very long instruction word (VLIW) microprocessor, a processor implementing other instruction sets, or processors implementing a combination of instruction sets. The processing circuit 602 is configured to execute processing logic in instructions for performing the operations and steps discussed herein.

The computer system 600 may further include a network interface device 610. The computer system 600 also may or may not include an input 612 to receive input and selections to be communicated to the computer system 600 when executing instructions. The computer system 600 also may or may not include an output 614, including but not limited to a display, a video display unit (e.g., a liquid crystal display (LCD) or a cathode ray tube (CRT)), an alphanumeric input device (e.g., a keyboard), and/or a cursor control device (e.g., a mouse).

The computer system 600 may or may not include a data storage device that includes instructions 616 stored in a computer-readable medium 618. The instructions 616 may also reside, completely or at least partially, within the main memory 604 and/or within the processing circuit 602 during execution thereof by the computer system 600, the main memory 604 and the processing circuit 602 also constituting computer-readable medium. The instructions 616 may further the transmitted or received over a network 620 via the network interface device 610.

While the computer-readable medium 618 is shown in an exemplary embodiment to be a single medium, the term "computer-readable medium" should be taken to include a single medium or multiple media (e.g., a centralized or distributed database, and/or associated caches and servers) that store the one or more sets of instructions. The term "computer-readable medium" shall also be taken to include any medium that is capable of storing, encoding or carrying a set of instructions for execution by the processing circuit and that cause the processing circuit to perform any one or more of the methodologies of the embodiments disclosed herein. The term "computer-readable medium" shall accordingly be taken to include, but not be limited to, solid-state memories, optical and magnetic medium, and carrier wave signals.

Note that as an example, any "ports," "combiners," "splitters," and other "circuits" mentioned in this description may be implemented using Field Programmable Logic Array(s) (FPGA(s)) and/or a digital signal processor(s) (DSP(s)), and therefore, may the embedded within the FPGA or be performed by computational processes.

The embodiments disclosed herein include various steps. The steps of the embodiments disclosed herein may be performed by hardware components or may be embodied in machine-executable instructions, which may be used to cause a general-purpose or special-purpose processor programmed with the instructions to perform the steps. Alternatively, the steps may be performed by a combination of hardware and software.

The embodiments disclosed herein may be provided as a computer program product, or software, that may include a machine-readable medium (or computer-readable medium) having stored thereon instructions, which may be used to program a computer system (or other electronic devices) to perform a process according to the embodiments disclosed herein. A machine-readable medium includes any mechanism for storing or transmitting information in a form readable by a machine (e.g., a computer). For example, a machine-readable medium includes a machine-readable storage medium (e.g., read only memory ("ROM"), random access memory ("RAM"), magnetic disk storage medium, optical storage medium, flash memory devices, etc.).

The various illustrative logical blocks, modules, and circuits described in connection with the embodiments disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A controller may be a processor. A processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The embodiments disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer-readable medium known in the art. An exemplary storage medium is coupled to the processor such that the processor can read information from, and write information to, the storage medium. In the alternative, the storage medium may the integral to the processor. The processor and the storage medium may reside in an ASIC. The ASIC may reside in a remote station. In the alternative, the processor and the storage medium may reside as discrete components in a remote station, base station, or server.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that any particular order be inferred. It will be apparent to those skilled in the art that various modifications and variations can be made without departing from the spirit or scope of the invention. Since modifications combinations, sub-combinations and variations of the disclosed embodiments incorporating the spirit and substance of the invention may occur to persons skilled in the art, the invention should be construed to include everything within the scope of the appended claims and their equivalents.

We claim:

1. A multi-band remote unit for a wireless communications system (WCS), comprising:
a digital front-end integrated circuit (IC), comprising:
a digital interface circuit communicatively coupled to a central unit in the WCS and configured to:
receive an encapsulated downlink digital communications signal corresponding to a plurality of frequency bands from the central unit; and
generate a plurality of downlink digital communications signals associated with the plurality of frequency bands, respectively, based on the encapsulated downlink digital communications signal; and
a digital processing circuit configured to receive and digitally process the plurality of downlink digital communications signals; and
a plurality of radio frequency (RF) front-end circuits provided outside the digital front-end IC, the plurality of RF front-end circuits configured to:
receive the plurality of downlink digital communications signals, respectively, from the digital processing circuit; and
convert the plurality of downlink digital communications signals into a plurality of downlink RF communications signals for transmission in the plurality of frequency bands, respectively,
wherein the plurality of RF front-end circuits comprises a plurality of downlink paths, the plurality of downlink paths comprising:
a plurality of digital-to-analog converters (DACs) coupled to the digital processing circuit and configured to convert the plurality of downlink digital communications signals into a plurality of downlink intermediate frequency (IF) communications signals, respectively;
a plurality of downlink frequency conversion circuits configured to convert the plurality of downlink IF communications signals into the plurality of downlink RF communications signals, respectively; and
a plurality of power amplifiers configured to amplify the plurality of downlink RF communications signals for transmission in the plurality of frequency bands, respectively.

2. The multi-band remote unit of claim 1, wherein the digital front-end IC is a field-programmable gate array (FPGA).

3. The multi-band remote unit of claim 1, wherein the digital processing circuit comprises:
a plurality of crest factor reduction (CFR) circuits configured to reduce peak-to-average ratios (PARs) of the plurality of downlink digital communications signals, respectively; and
a plurality of digital pre-distortion (DPD) circuits coupled to the plurality of CFR circuits, respectively, the plurality of DPD circuits configured to digitally pre-distort the plurality of downlink digital communications signals to compensate nonlinear distortions associated with the plurality of power amplifiers, respectively.

4. The multi-band remote unit of claim 3, further comprising a plurality of DPD feedback paths coupled between the plurality of power amplifiers and the plurality of DPD circuits, respectively, the plurality of DPD feedback paths comprising:
a plurality of feedback frequency conversion circuits coupled to the plurality of power amplifiers and configured to convert the plurality of downlink RF communications signals into a plurality of IF feedback signals, respectively; and
a plurality of feedback analog-to-digital converters (ADCs) coupled to the plurality of DPD circuits and configured to convert the plurality of IF feedback signals into a plurality of digital feedback signals, respectively;
wherein the plurality of DPD circuits is further configured to digitally pre-distort the plurality of downlink digital communications signals based on the plurality of digital feedback signals, respectively.

5. The multi-band remote unit of claim 3, wherein the digital interface circuit comprises:
an encapsulation/decapsulation circuit coupled to the central unit and configured to decapsulate the encapsulated downlink digital communications signal to extract the plurality of frequency bands; and
a routing circuit configured to:
generate the plurality of downlink digital communications signals corresponding to the plurality of frequency bands; and
route the plurality of downlink digital communications signals to the plurality of CFR circuits, respectively.

6. The multi-band remote unit of claim 5, further comprising an antenna combiner/splitter circuit coupled to an antenna port, the antenna combiner/splitter circuit configured to combine the plurality of downlink RF communications signal to generate a combined downlink RF communications signal for transmission via the antenna port.

7. The multi-band remote unit of claim 6, wherein the antenna combiner/splitter circuit is further configured to:
receive a combined uplink RF communications signal corresponding to the plurality of frequency bands via the antenna port; and
split the combined uplink RF communications signal to generate a plurality of uplink RF communications signals associated with the plurality of frequency bands, respectively.

8. The multi-band remote unit of claim 7, wherein the plurality of RF front-end circuits further comprises a plurality of uplink paths coupled between the antenna combiner/splitter circuit and the routing circuit, the plurality of uplink paths comprising:
a plurality of uplink frequency conversion circuits configured to convert the plurality of uplink RF communications signals into a plurality of uplink IF communications signals, respectively; and
a plurality of analog-to-digital converters (ADCs) configured to convert the plurality of uplink IF communications signals into a plurality of uplink digital communications signals, respectively.

9. The multi-band remote unit of claim 8, wherein:
the routing circuit is further configured to:
receive the plurality of uplink digital communications signals from the plurality of ADCs, respectively; and
provide the plurality of uplink digital communications signals to the encapsulation/decapsulation circuit; and
the encapsulation/decapsulation circuit is further configured to:
encapsulate the plurality of uplink digital communications signals to generate an encapsulated uplink digital communications signal; and
provide the encapsulated uplink digital communications signal to the central unit.

10. A multi-band remote unit for a wireless communications system (WCS), comprising:
a digital front-end printed circuit board (PCB), comprising:
a digital interface circuit communicatively coupled to a central unit in the WCS and configured to:
receive an encapsulated downlink digital communications signal corresponding to a plurality of frequency bands from the central unit; and
generate a plurality of downlink digital communications signals associated with the plurality of frequency bands, respectively, based on the encapsulated downlink digital communications signal; and
a digital processing circuit configured to receive and digitally process the plurality of downlink digital communications signals; and
a plurality of radio frequency (RF) front-end circuits provided outside the digital front-end PCB, the plurality of RF front-end circuits is configured to:
receive the plurality of downlink digital communications signals, respectively, from the digital processing circuit; and
convert the plurality of downlink digital communications signals into a plurality of downlink RF communications signals for transmission in the plurality of frequency bands, respectively,
wherein the plurality of RF front-end circuits comprises a plurality of downlink paths, the plurality of downlink paths comprising:
a plurality of digital-to-analog converters (DACs) coupled to the digital processing circuit and configured to convert the plurality of downlink digital communications signals into a plurality of downlink intermediate frequency (IF) communications signals, respectively;
a plurality of downlink frequency conversion circuits configured to convert the plurality of downlink IF communications signals into the plurality of downlink RF communications signals, respectively; and
a plurality of power amplifiers configured to amplify the plurality of downlink RF communications signals for transmission in the plurality of frequency bands, respectively.

11. The multi-band remote unit of claim 10, wherein the digital interface circuit and the digital processing circuit are provided in a field-programmable gate array (FPGA).

12. The multi-band remote unit of claim 10, wherein the digital processing circuit comprises:
a plurality of crest factor reduction (CFR) circuits configured to reduce peak-to-average ratios (PARs) of the plurality of downlink digital communications signals, respectively; and
a plurality of digital pre-distortion (DPD) circuits coupled to the plurality of CFR circuits, respectively, the plurality of DPD circuits configured to digitally pre-distort the plurality of downlink digital communications signals to compensate nonlinear distortions associated with the plurality of power amplifiers, respectively.

13. The multi-band remote unit of claim 12, further comprising a plurality of DPD feedback paths coupled between the plurality of power amplifiers and the plurality of DPD circuits, respectively, the plurality of DPD feedback paths comprising:
a plurality of feedback frequency conversion circuits coupled to the plurality of power amplifiers and configured to convert the plurality of downlink RF communications signals into a plurality of IF feedback signals, respectively; and
a plurality of feedback analog-to-digital converters (ADCs) coupled to the plurality of DPD circuits and configured to convert the plurality of IF feedback signals into a plurality of digital feedback signals, respectively;
wherein the plurality of DPD circuits is further configured to digitally pre-distort the plurality of downlink digital communications signals based on the plurality of digital feedback signals, respectively.

14. The multi-band remote unit of claim 12, wherein the digital interface circuit comprises:
an encapsulation/decapsulation circuit coupled to the central unit and configured to decapsulate the encapsulated downlink digital communications signal to extract the plurality of frequency bands; and
a routing circuit configured to:
generate the plurality of downlink digital communications signals corresponding to the plurality of frequency bands; and
route the plurality of downlink digital communications signals to the plurality of CFR circuits, respectively.

15. The multi-band remote unit of claim 14, further comprising an antenna combiner/splitter circuit coupled to an antenna port, the antenna combiner/splitter circuit configured to combine the plurality of downlink RF communications signal to generate a combined downlink RF communications signal for transmission via the antenna port.

16. The multi-band remote unit of claim 15, wherein the antenna combiner/splitter circuit is further configured to:
receive a combined uplink RF communications signal corresponding to the plurality of frequency bands via the antenna port; and
split the combined uplink RF communications signal to generate a plurality of uplink RF communications signals associated with the plurality of frequency bands, respectively.

17. The multi-band remote unit of claim 16, wherein the plurality of RF front-end circuits further comprises a plurality of uplink paths coupled between the antenna combiner/splitter circuit and the routing circuit, the plurality of uplink paths comprising:
a plurality of uplink frequency conversion circuits configured to convert the plurality of uplink RF communications signals into a plurality of uplink IF communications signals, respectively; and
a plurality of analog-to-digital converters (ADCs) configured to convert the plurality of uplink IF communications signals into a plurality of uplink digital communications signals, respectively.

18. The multi-band remote unit of claim 17, wherein:
the routing circuit is further configured to:
receive the plurality of uplink digital communications signals from the plurality of ADCs, respectively; and
provide the plurality of uplink digital communications signals to the encapsulation/decapsulation circuit; and
the encapsulation/decapsulation circuit is further configured to:
encapsulate the plurality of uplink digital communications signals to generate an encapsulated uplink digital communications signal; and
provide the encapsulated uplink digital communications signal to the central unit.

19. The multi-band remote unit of claim 15, further comprising an RF front-end PCB separated from the digital front-end PCB and configured to comprise the plurality of RF front-end circuits and the antenna combiner/splitter circuit.

20. The multi-band remote unit of claim 15, further comprising:
- an RF front-end PCB separated from the digital front-end PCB and configured to comprise the plurality of RF front-end circuits, respectively; and
- an antenna front-end PCB separated from the digital front-end PCB and the RF front-end PCB and configured to comprise the antenna combiner/splitter circuit.

21. The multi-band remote unit of claim 15, further comprising:
- a plurality of RF front-end PCBs separated from the digital front-end PCB and configured to comprise the plurality of RF front-end circuits, respectively; and
- an antenna front-end PCB separated from the digital front-end PCB and the plurality of RF front-end PCBs and configured to comprise the antenna combiner/splitter circuit.

* * * * *